United States Patent
Yang et al.

(10) Patent No.: US 7,550,351 B2
(45) Date of Patent: Jun. 23, 2009

(54) STRUCTURE AND METHOD FOR CREATION OF A TRANSISTOR

(75) Inventors: Haining Yang, Wappingers Falls, NY (US); Xiangdong Chen, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 208 days.

(21) Appl. No.: 11/538,850

(22) Filed: Oct. 5, 2006

(65) Prior Publication Data

US 2008/0085585 A1    Apr. 10, 2008

(51) Int. Cl.
*H01L 21/336* (2006.01)
*H01L 21/8234* (2006.01)
*H01L 21/8238* (2006.01)
*H01L 21/331* (2006.01)

(52) U.S. Cl. .................... 438/269; 438/197; 438/312; 438/232

(58) Field of Classification Search ................. 438/269, 438/301, 142, 185–186, 191, 220, 231, 312, 438/197
See application file for complete search history.

(56) References Cited

U.S. PATENT DOCUMENTS

| | | | |
|---|---|---|---|
| 6,005,013 A | 12/1999 | Suh et al. | |
| 6,316,302 B1 * | 11/2001 | Cheek et al. | ................ 438/199 |
| 6,495,408 B1 | 12/2002 | Hsia et al. | |
| 6,508,129 B1 | 1/2003 | Sittler | |
| 6,649,460 B2 | 11/2003 | Leobandung | |
| 6,891,192 B2 | 5/2005 | Chen et al. | |
| 6,906,360 B2 | 6/2005 | Chen et al. | |
| 6,939,814 B2 | 9/2005 | Chan et al. | |
| 6,946,709 B2 | 9/2005 | Yang | |
| 2003/0057453 A1 | 3/2003 | Trivedi et al. | |
| 2008/0085585 A1 * | 4/2008 | Yang et al. | .................. 438/269 |

* cited by examiner

*Primary Examiner*—Chuong Anh Luu
(74) *Attorney, Agent, or Firm*—H. Daniel Schnurmann

(57) ABSTRACT

The invention is directed to an improved transistor that reduces dopant cross-diffusion and improves chip density. A first embodiment of the invention comprises gate electrode material partially removed at a junction of a first gate electrode region comprised of gate material doped with first ions for a first device and second gate electrode region comprised of gate material doped with second ions for a second device. The respectively doped regions are connected by a silicide layer near the top surface of the gate conductors.

9 Claims, 9 Drawing Sheets

STRUCTURE AND METHOD FOR CREATION OF A TRANSISTOR

BACKGROUND OF THE INVENTION

1. Field of the Invention

The invention relates generally to semiconductor devices, and more particularly to a novel transistor and method for creation of the same.

2. Description of the Related Art

As semiconductor devices being scaled to achieve high performance and high density circuits, device lateral dimension become smaller. Dopant cross diffusion between oppositely doped regions along shared gate conductor becomes a severe issue. The cross diffusion varies work function of the gate conductor and hence shifts the threshold voltage ($V_t$) of transistors. At a circuit level, shifted $V_t$ increases transistor mismatch, resulting in low circuit performance or even circuit failures.

FIG. 1 depicts a prior art FET. The feature characteristic of this prior art FET is the dopant cross diffusion that occurs at the junction 130 of the N and P type doped regions. As depicted in FIG. 1, a larger percentage of N type dopant cross diffusion occurs at the P/N junction 130 closest to the gate electrode region doped with N type dopant ions 120, while a larger percentage of P type dopant cross diffusion occurs at the P/N junction 130 closest to the gate electrode region doped with P type dopant ions 110. As depicted in FIG. 1, a larger overall percentage of dopant cross diffusion occurs near the top portion of the junction 130 than near the bottom portion of the junction 130, mainly because dopants are implanted to the region close to the top surface of the gate conductor.

The prior art FET of FIG. 1 suffers the disadvantage of the requirement of large spacing between N/ and P/FETs in order to prevent the adverse effects of dopant cross diffusion that occurs at the P/N junction 130. Adverse effects of dopant cross diffusion that occurs at the P/N junction 130 includes higher device mismatch. As semiconductor devices shrink, the industry is under increasing pressure to place devices, such as the N/ and P/FETs, at ever decreasing distances relative to each other. In the case of the prior art FET of FIG. 1, however, chip designers are limited because the distance between the N/ and P/FET can be no closer than the area of the dopant cross diffusion, which occurs at the junction 130 of the N and P type doped regions.

FIG. 2 depicts another prior art FET. The feature characteristic of this prior art FET is that the area of dopant cross diffusion shown in FIG. 1, which occurs at the junction 130 of the N and P type doped regions, has been entirely removed. In its place an interconnect layer of conductive material 190 such as tungsten plug or a TiN layer is formed over the spacers 170, the gate electrode region doped with N type dopant ions 120, the gate electrode region doped with P type dopant ions 110, as well as in the space created by removal of the area of dopant cross diffusion shown in FIG. 1.

The prior art FET of FIG. 2 suffers the disadvantages of lowering chip density and increasing the risk of shorting transistor source and drain regions. As the gate is completely removed from the junction 130, it requires the tips of the gate conductors extend over the active region to maintain gate control to the channel region and to prevent source/drain shorting. In current state-of-the-art semiconductor manufacturing technology, the minimum spacing between n and p doped regions are too small to allow the complete removal of the gate material without risking shorting the source/drain region. The prior art may require an increased N/P spacing, which results in lower chip density. The prior art also requires a tungsten plug or TiN layer to be formed over the completely removed gate conductor region to connect n and p doped gate conductors. Similarly, the minimum N/P spacing does not have enough room to allow for the formation of these structures without shorting source/drain of the transistors.

What is needed in the art is an improved N/ and P/junction that reduces dopant cross diffusion without comprising chip density.

BRIEF SUMMARY OF THE INVENTION

The invention is directed to a transistor structure and method for creation of the same.

A first embodiment is directed to a semiconductor structure comprising a first gate electrode region, a second gate electrode region, and a silicide layer. The first gate electrode region comprises a gate electrode material doped with first ions for a first device. The second gate electrode region comprises a gate electrode material doped with second ions for a second device. The gate electrode region is partially removed at a junction of the first and second regions. The silicide layer is over the partially removed gate electrode region.

A second embodiment is directed to a method for forming a semiconductor structure comprising two doping and a removing step. One doping step comprises doping a gate material with ions of a first conductivity type in a first region of the gate material while substantially preventing a second region of the gate material from first conductivity type doping. One doping step comprises doping the gate material with ions of a second conductivity type in the second region while substantially preventing the first region of the gate material from first conductivity type doping in the first region. The doping steps create a junction at which the first conductivity type doped region adjacently meets the second conductivity type doped region. The removing step comprises removing a portion of the junction such that the first conductivity type doped region adjacently meets the second conductivity type doped region only at a remaining portion of the junction.

The invention solves the aforementioned problems associated with prior art transistors. More specifically, the invention partially removes the top portion of the gate near the junction where dopant cross diffusion is the highest, without risking the shorting of the source/drain. The followed self-aligned silicidation process connects the N+/P+ gate conductor, without requiring separated interconnect layer.

For at least the foregoing reasons, the invention improves transistor technology.

BRIEF DESCRIPTION OF THE DRAWINGS

The features and the element characteristics of the invention are set forth with particularity in the appended claims. The figures are for illustrative purposes only and are not drawn to scale. Furthermore, like numbers represent like features in the drawings. The invention itself, however, both as to organization and method of operation, may best be understood by reference to the detailed description which follows, taken in conjunction with the accompanying figures, in which:

DETAILED DESCRIPTION OF THE INVENTION

The invention will now be described with reference to the accompanying figures. In the figures, various aspects of the structures have been depicted and schematically represented in a simplified manner to more clearly describe and illustrate the invention.

By way of overview and introduction, the embodiments of the invention are directed to a semiconductor structure and method for creation of the same. All embodiments comprise gate electrode material partially removed at a junction 130 of a first gate electrode region comprised of gate material doped with first ions for a first device 110 and second gate electrode region comprised of gate material doped with second ions for a second device 120.

Figure 3:
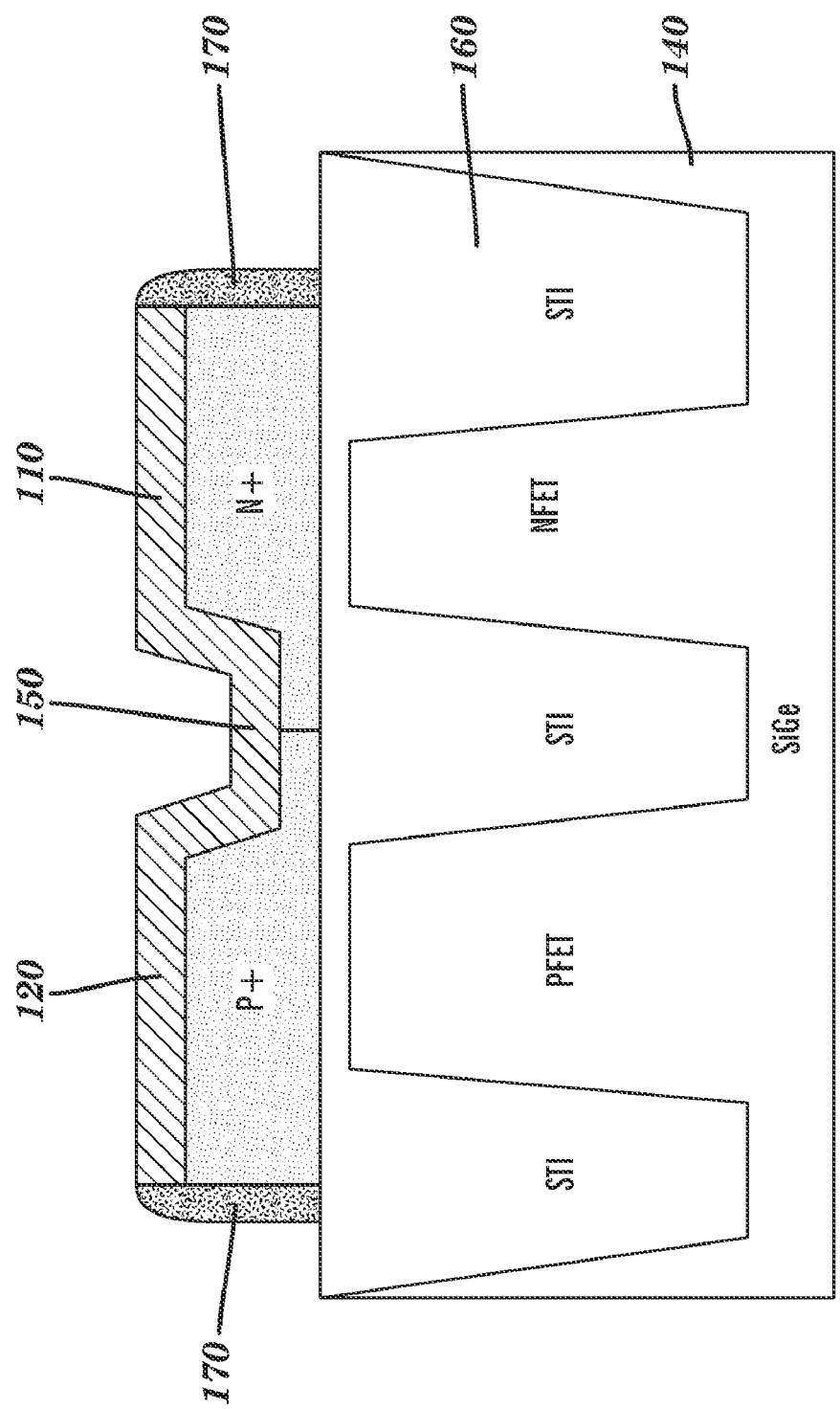
FIG. 3 depicts a FET in accordance with a first embodiment of the invention; and, FIGS. 4a-4f depict a method for forming the FET of FIG. 3.

A first embodiment of the invention will be described with reference to the FIG. 3, which depicts an electrode material partially removed at a junction 130 of a first gate electrode region comprised of gate material doped with first ions for a first device 110 and second gate electrode region comprised of gate material doped with second ions for a second device 120. Note that as depicted in FIG. 3, while the junction 130 has been partially removed, dopant cross diffusion still occurs, however the dopant cross diffusion has been significantly reduced. While FIG. 3 depicts a remaining area of dopant cross diffusion that occurs at the junction 130, as one skilled in the art would recognize the entire area of dopant cross diffusion could be removed through the partial removal of the junction 130.

Figure 2:
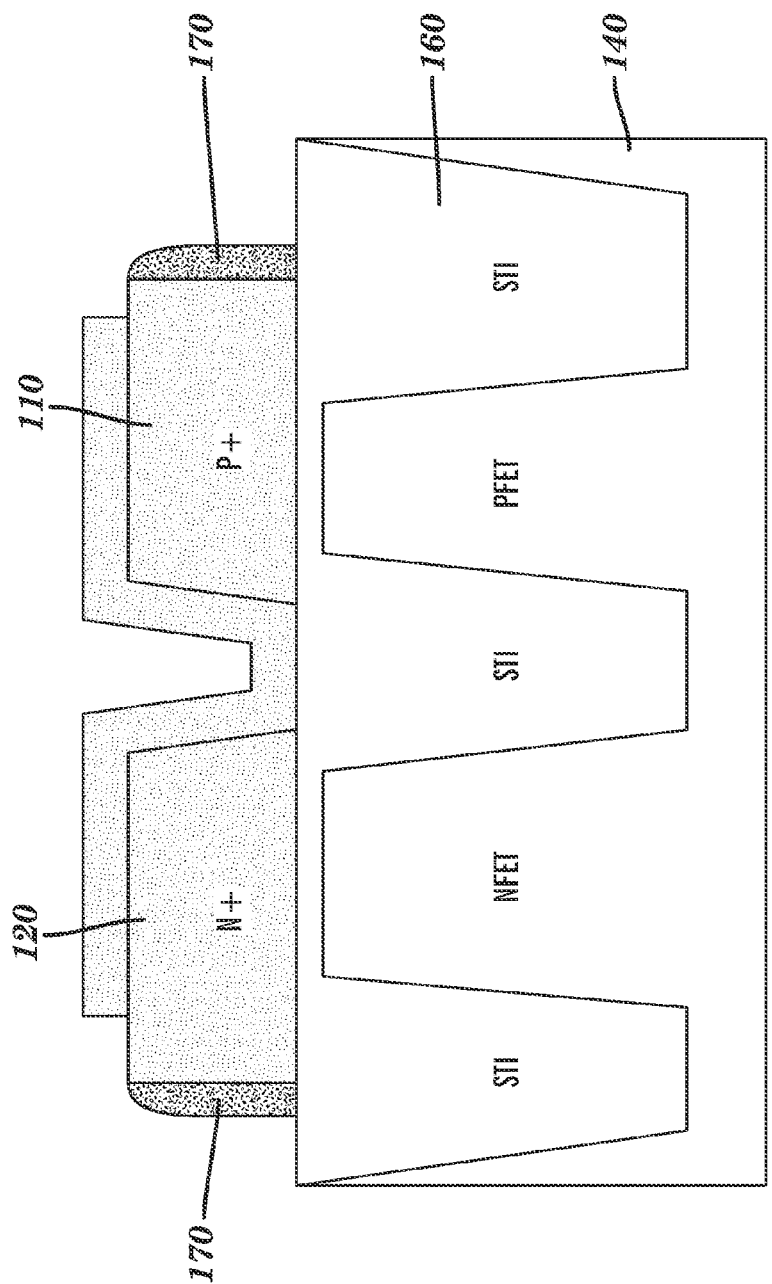
FIG. 2 depicts another prior art FET.

Unlike the prior art depicted in FIG. 2, the first embodiment depicted in FIG. 3 does not remove the entire P/N junction 130. The advantages of maintaining a portion of the P/N junction 130 are that gate conductor remains continuous and risk of shorting source/drain is prevented. Also, the self-aligned silicide 150 can still form over partially removed gate conductor surface. Instead, the first embodiment includes a silicide 150 over the first gate electrode region comprised of a gate material doped with first ions for a first device 110, the junction 130, and the second gate electrode region comprised of a gate material doped with second ions for a second device 120. The purpose of the silicide 150 is to form low resistance connection between the two oppositely doped gate conductor regions.

Figure 1:
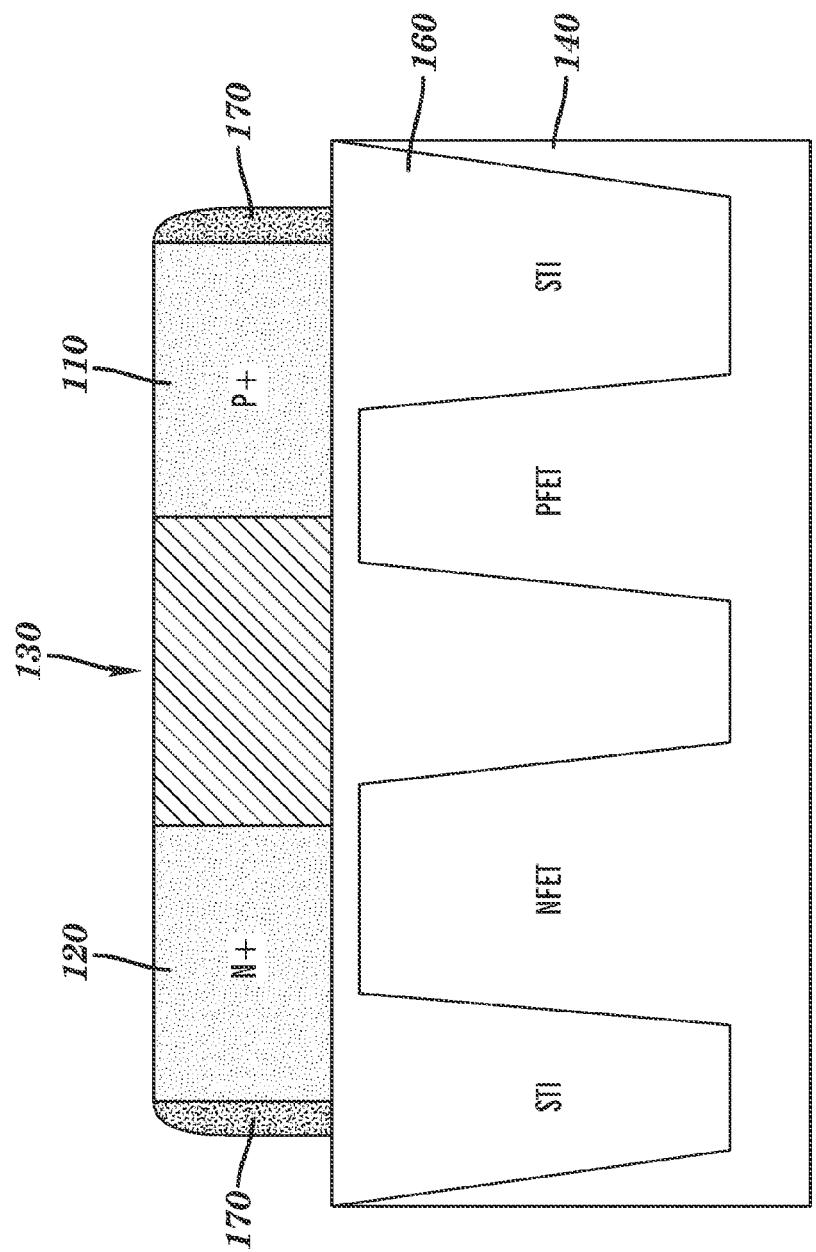
FIG. 1 depicts a prior art field effect transistor ("FET")

Further unlike the prior art depicted in FIG. 1, the first embodiment depicted in FIG. 3 minimizes the section of the P/N junction 130 with the greatest potential for dopant cross diffusion. The advantage of minimizing the section of the P/N junction 130 with the greatest potential for dopant cross diffusion is because dopant concentration is of the highest near the top region of the gate conductors. Therefore, the first embodiment enables chip designer to space P/ and N/FETs within closer distances of each other, which consequently enables greater chip density, an ever reaching goal as semiconductor industry advances.

Note that the materials that comprise the first embodiment depicted in FIG. 3 are varied. The silicide 150 preferably comprises a metal silicide, such as $NiSi_x$, $NiPtSi_x$, $CoSi_x$, $TiSi_x$, $YbSi_x$, or $ErSi_x$. The substrate 140 preferably comprises a semiconductor material, including Si, SiGe, SiC, or GaAs. Finally, the gate material of both the first and second gate electrode regions, 110 and 120 respectively, comprises a conductive material, such as a doped semiconductor material, metal, metal silicide or a metal nitride, and more specifically, comprises Si, SiGe, $NiSi_x$, $TiSi_x$, W, TiN, TaN, or a combination of two or more of these materials.

Figure 4A:
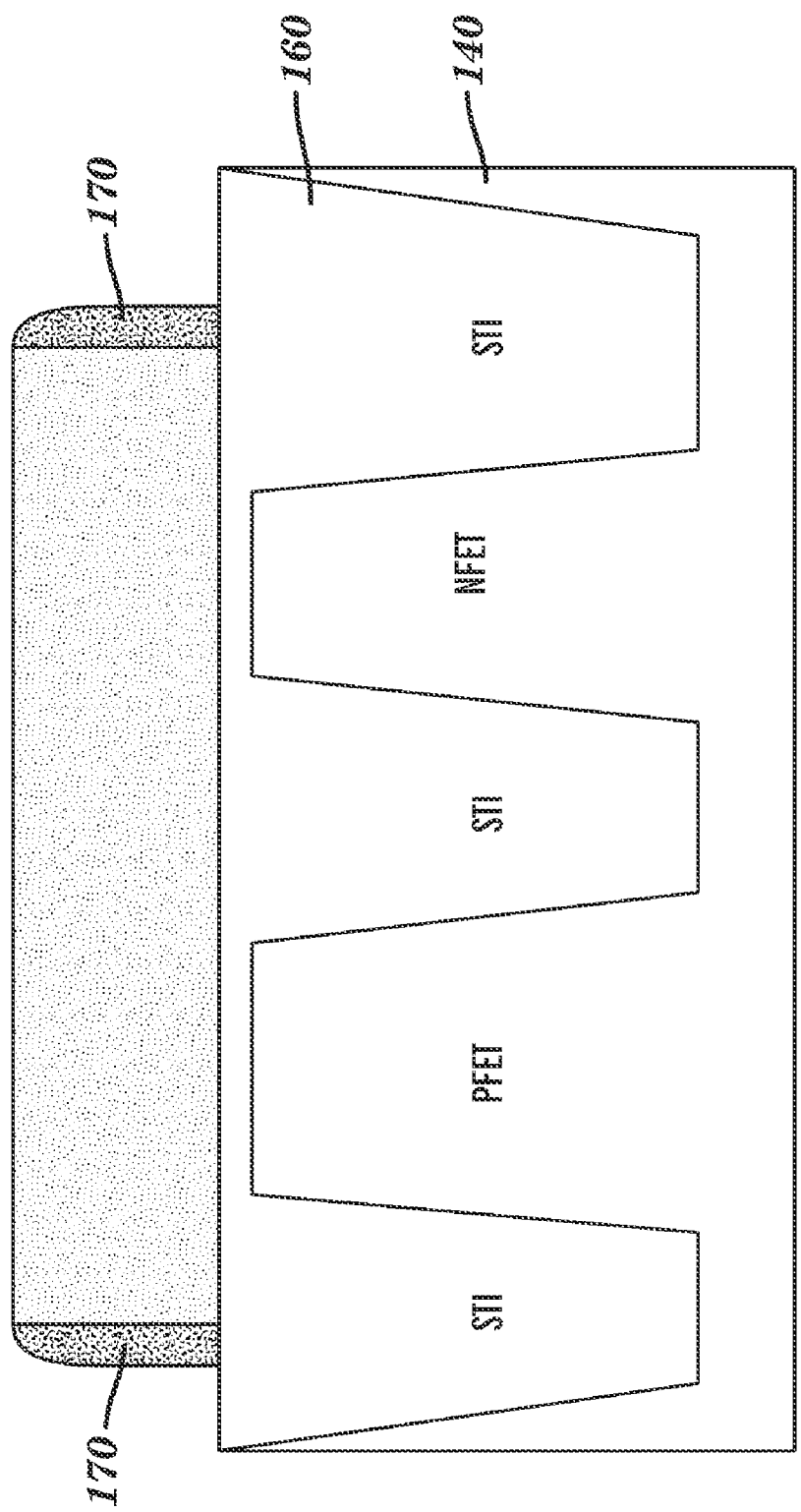

FIGS. 4a-4f depict a method for forming the FET of FIG. 3. In FIG. 4a, a base device is depicted. The base device comprises a gate material 190 with two spacers 170 on either side of the conductive material 190. As mentioned herein above, the gate material is preferable a conductive material, such as a metal silicide or a metal nitride, and more specifically, comprises Si, SiGe, NiSix, $TiSi_x$, TiN, or TaN. The gate material 190 is deposited on substrate 160. As mentioned herein above, the substrate 160 comprises a semiconductor material, such as Si, SiGe, SiC, or GaAs.

Figure 4B:
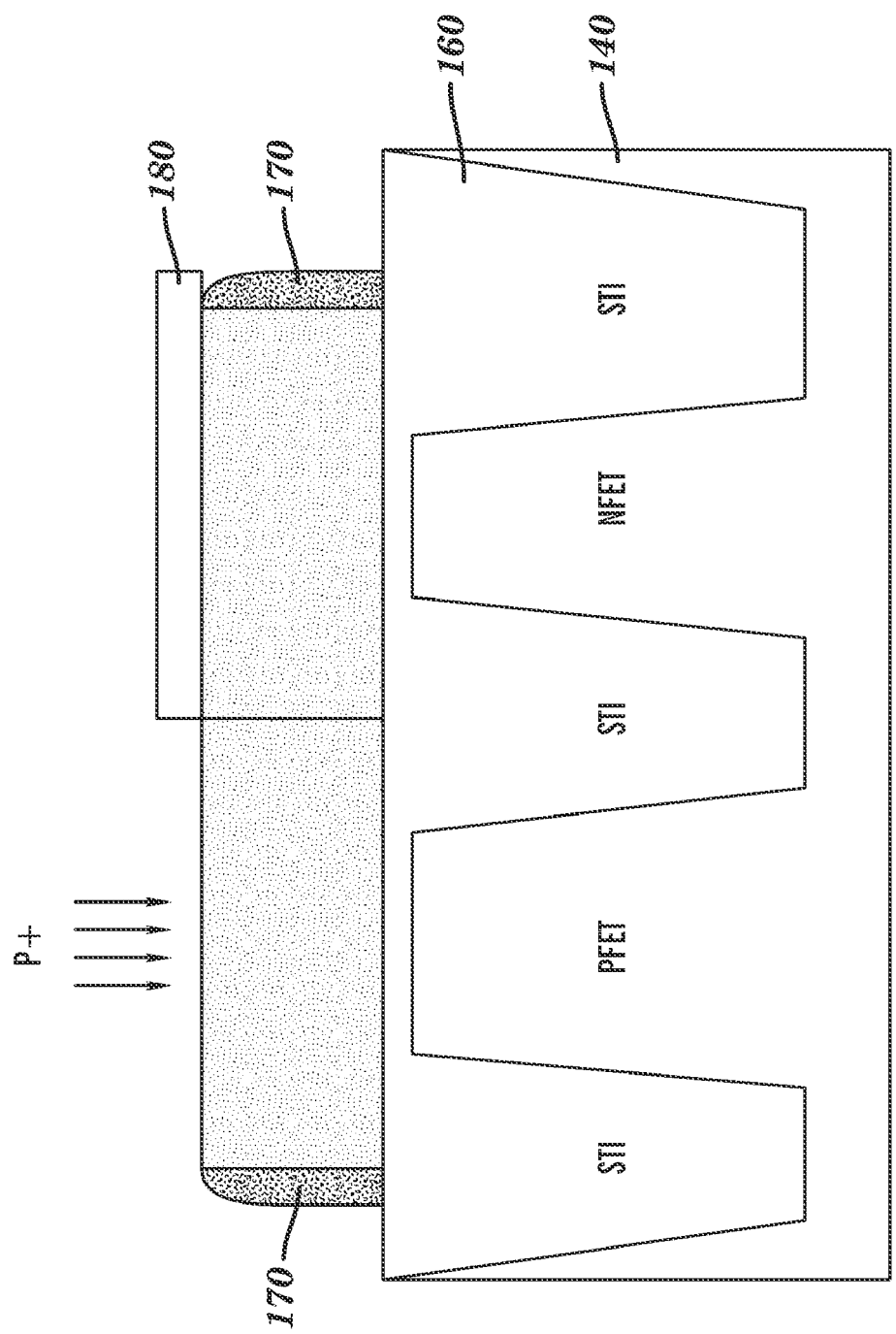

As depicted in FIG. 4b, the gate material is doped with ions of a first conductivity type is a first region of the gate material 110. In FIG. 4b, the ions of a first conductivity type comprise P type ions. Simultaneously, the second region of the gate material 120 is prevented from doping of a first conductivity type with a masking layer 180.

Figure 4C:
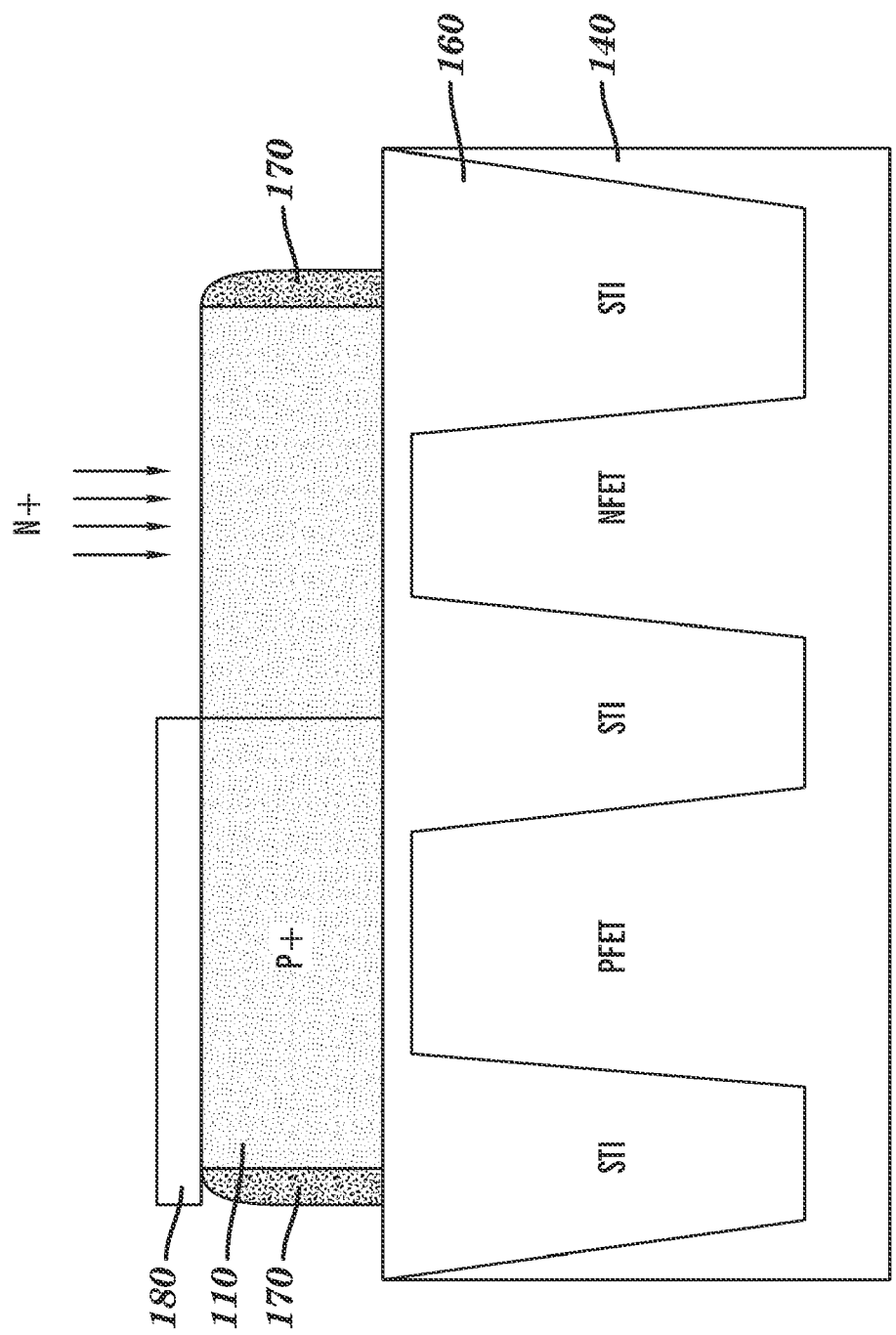

Following the doping of the first region 110 depicted in FIG. 4b, the second region 120 is doped in FIG. 4c. Similar to FIG. 4b, while the second region 120 is doped with ions of a second conductivity type, the first region 110 is protected from doping of the first conductivity type with a masking layer 180. The ions of the second conductivity type comprise N type ions in the illustrative example depicted in FIG. 4b. As one skilled in the art would recognize, the first region 110 could be doped with N type ions and the second region 120 could be doped with P type ions.

Figure 4D:
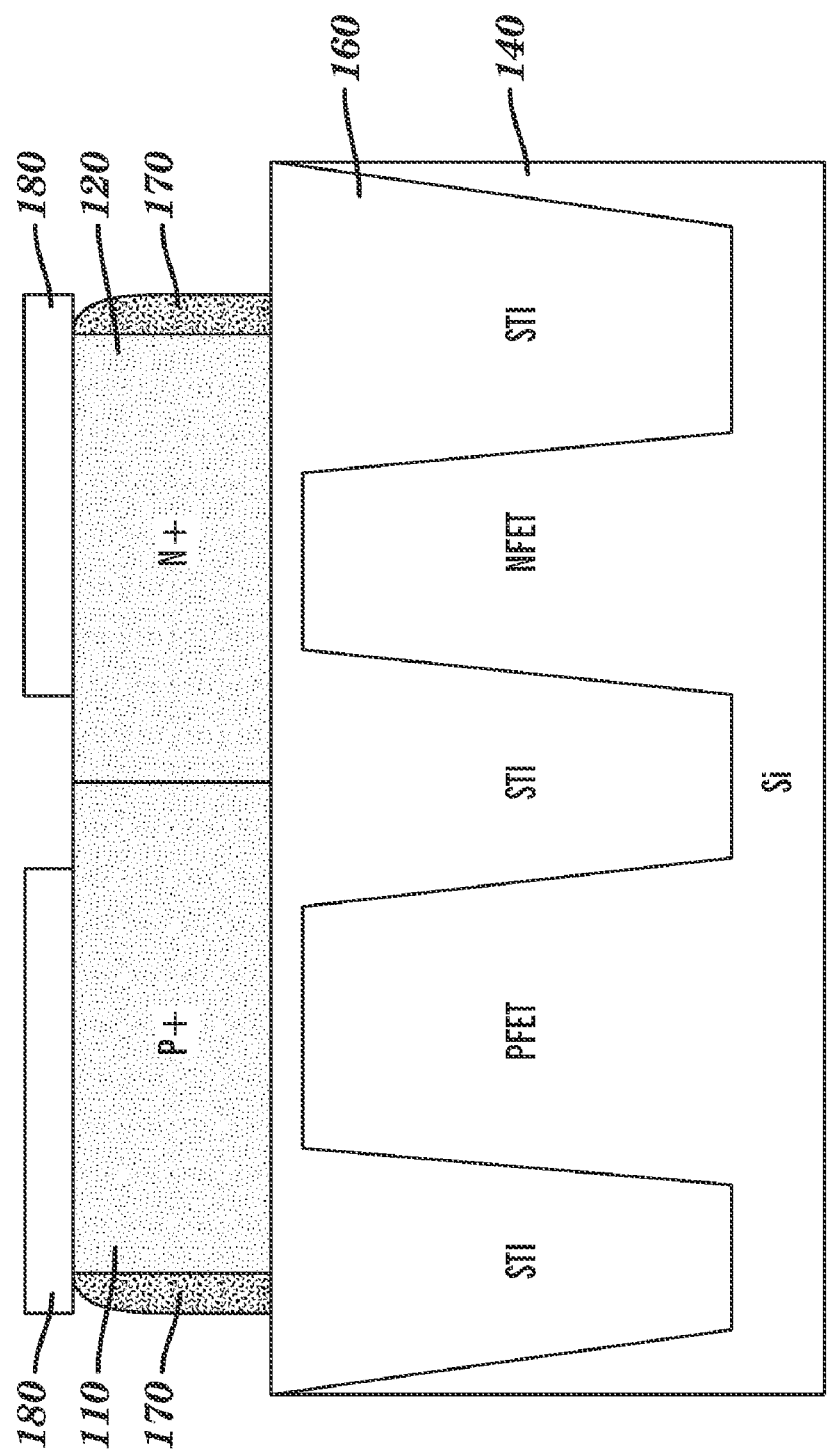
Figure 4E:
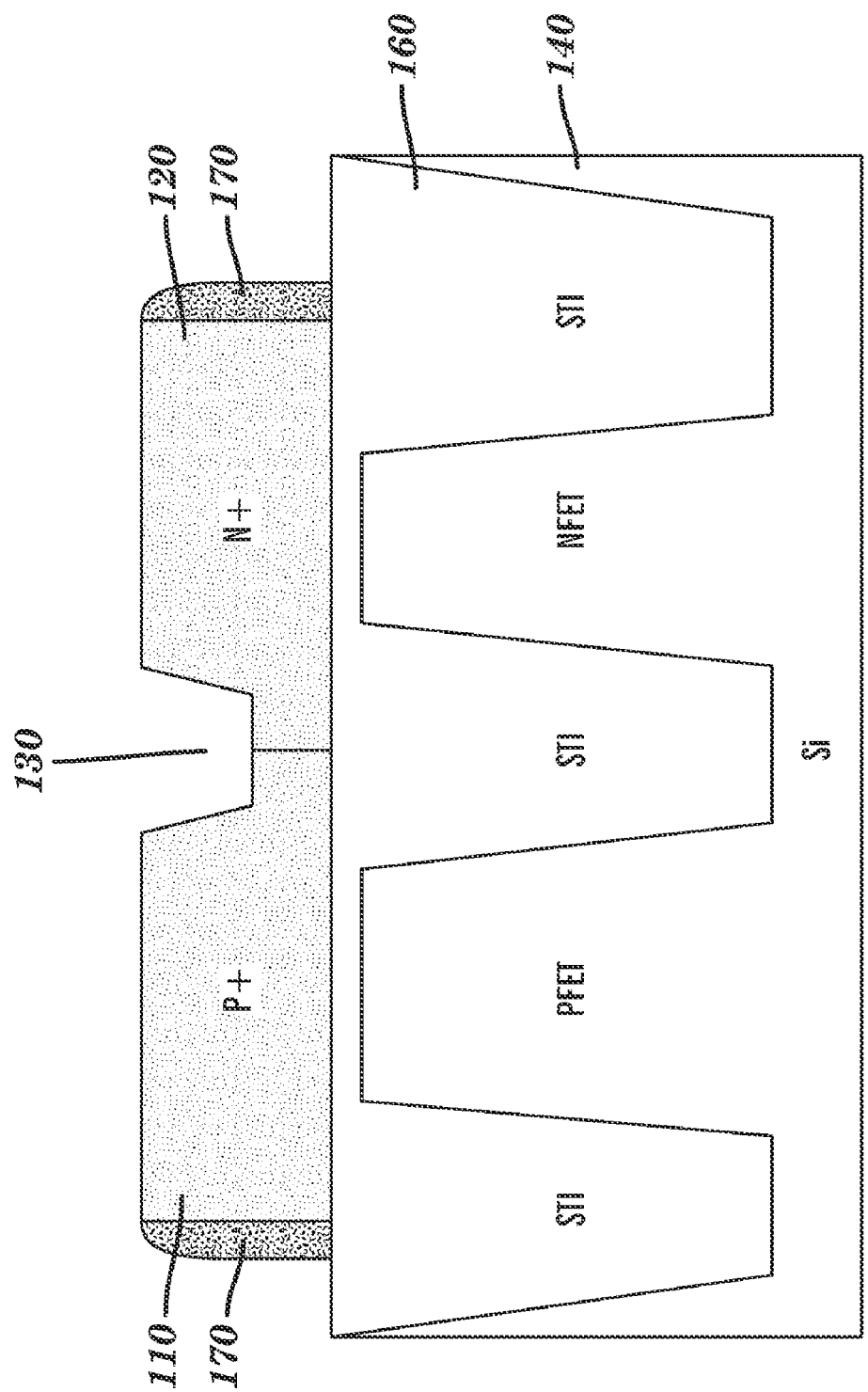
Figure 4F:
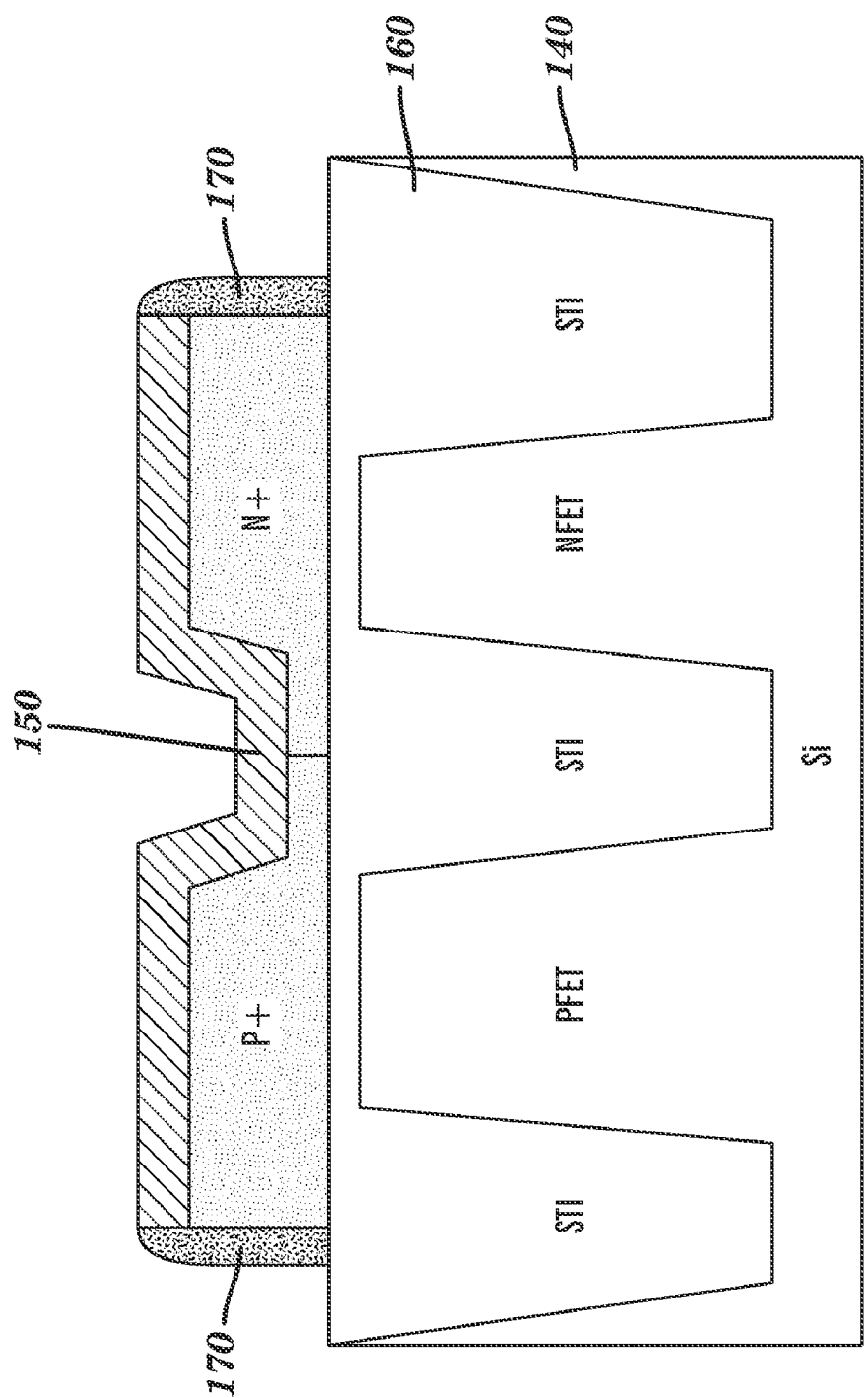

Once both the first and second regions, 110 and 120 respectively, have been doped, a junction 130 at which the first conductivity type doped region adjacently meets the second conductivity type doped region is created. Note that the junction 130 depicted in FIG. 4d, is reminiscently familiar with the N/P junction 130 depicted in prior art FIG. 1. Unlike the prior art depicted in FIG. 1, however, the junction 130 depicted in FIG. 4D will be substantially reduced. The junction 130 is substantially reduced through the use of a masking layer 180 that exposes the junction 130 between the first and second regions, 110 and 120 respectively, and enables the partial etching of the gate electrode region.

In FIG. 4D, the junction 130 has been partially removed. In a preferred embodiment of the invention, fifty to seventy percent (50-70%) of the junction 130 would be removed. Such partial removal of the junction 130 significantly reduces the adverse effect of dopant cross diffusion at the junction 130.

Once the junction 130 has been partially removed, dopant activation anneal including rapid thermal anneal, laser anneal is performed to activate dopants. A layer of self-aligned silicide 150 is formed over the entire structure, as depicted finally in FIG. 3.

The invention solves the aforementioned problems associated with prior art transistors. More specifically, the invention reduces dopant cross diffusion that occurs at N/P junctions without comprising chip density. There is no need for additional interconnect layer. And the patterning of the partial removal doesn't require minimum critical dimension lithography.

While the invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the invention.

What is claimed is:

1. A method for forming a semiconductor structure, comprising:

doping a gate material with ions of a first conductivity type in a first region of the gate material while substantially preventing a second region of the gate material from said first conductivity type doping;

doping the gate material with ions of a second conductivity type in the second region while substantially preventing the first region of the gate material from said second conductivity type doping, the doping steps create a junction at which the first conductivity type doped region adjacently meets the second conductivity type doped region; and, removing a portion of the junction such that the first conductivity type doped region adjacently meets the second conductivity type doped region only at a remaining portion of the junction.

2. A method as in claim 1, further comprising:

forming silicide over the gate material.

3. A method as in claim 1, the first doping step comprising masking the second region and implanting one of P-type dopant ions and N-type dopant ions in the first region.

4. A method as in claim 3, the second doping step comprising masking the first region and implanting one of P-type dopant ions and N-type dopant ions in the second region.

5. A method as in claim 4, the second doping step sequentially following the first doping step.

6. A method as in claim 1, the removing step comprising patterning a masking layer to expose the junction between the first and second regions and partially etching the gate material.

7. A method as in claim 1, the preventing step comprising masking said region with a polymer material.

8. A method as in claim 1, the gate material is partially removed before a dopant activation anneal step.

9. A method as in claim 1, wherein removing said portion of said junction comprises removing about 50 percent to about 70 percent of said junction, leaving a remaining portion of about 30 percent to about 50 percent.

* * * * *